INVENTORS
FORREST A. WESSELLS
DONALD P. GUSH
BY
Eugene W. Bond
ATTORNEY

Nov. 3, 1970 F. A. WESSELLS ET AL 3,537,853
PROCESS OF FORMING PRINTING PLATES, INCLUDING THE STEP OF SUBJECTING THE MOUNTED TRANSPARENCY TO A SURFACE STATIC ELECTRICITY ELIMINATOR
Filed Oct. 4, 1968 2 Sheets-Sheet 2

INVENTORS
FORREST A. WESSELLS
DONALD P. GUSH
BY
Eugene W. Bond
ATTORNEY 3,537,853

PROCESS OF FORMING PRINTING PLATES, INCLUDING THE STEP OF SUBJECTING THE MOUNTED TRANSPARENCY TO A SURFACE STATIC ELECTRICITY ELIMINATOR

Forrest Ashton Wessells, Baltimore, and Donald P. Gush, Hyattsville, Md., assignors to W. R. Grace & Co., New York, N.Y., a corporation of Connecticut Continuation-in-part of application Ser. No. 735,588, June 10, 1968, which is a continuation-in-part of application Ser. No. 707,299, Feb. 21, 1968. This application Oct. 4, 1968, Ser. No. 765,258
Int. Cl. G03c *5/00;* G03f *1/02*
U.S. Cl. 96—35.1 13 Claims

ABSTRACT OF THE DISCLOSURE

The disclosed invention is directed to a process of forming printing plates of a liquid photocurable composition and includes the step of exposing a mounted transparency to a surface static electricity eliminator prior to formation of a printing plate with actinic radiation projected through the mounted transparency positioned with an intermediate air space over a layer of liquid photocurable composition.

Figure 1:
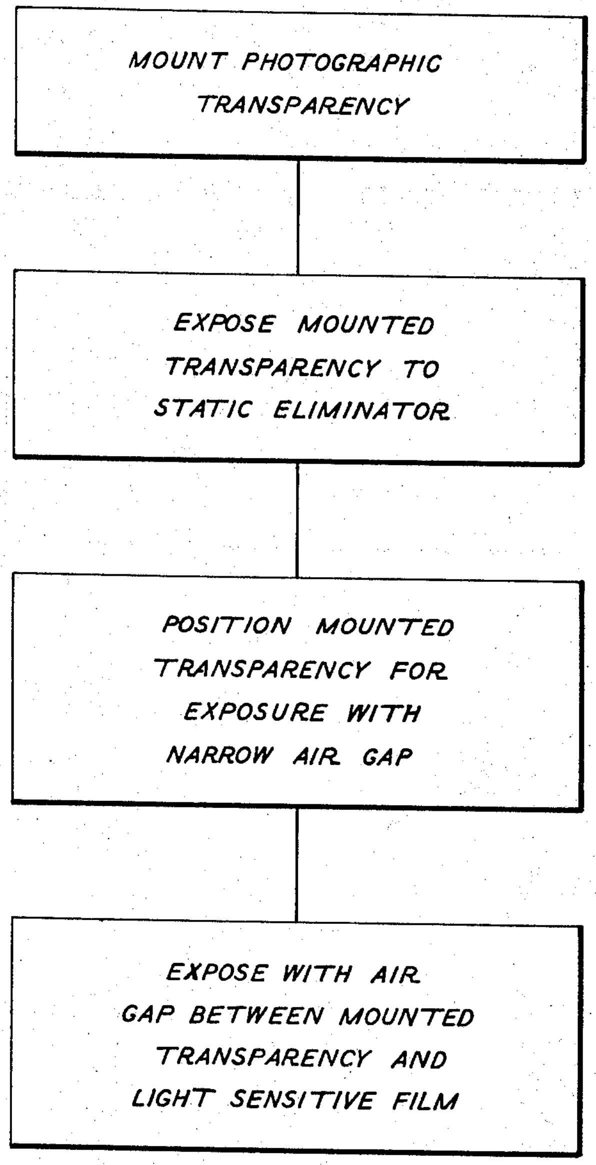

This application for U.S. Letters Patent is a continuation-in-part of copending application Ser. No. 735,588 filed June 10, 1968, which in turn is a continuation-in-part of copending application Ser. No. 707,299 filed Feb. 21, 1968.

The present invention relates to a process of forming printing plates of a liquid photocurable composition including the step of exposing a mounted transparency to a surface static electricity eliminator prior to formation of a printing plate with actinic radiation projected through the mounted transparency positioned with an intermediate air space over a layer of liquid photocurable composition.

More particularly, the present invention is directed to a process of forming a solid relief printing plate operable on conventional presses from a supported liquid photocurable composition by selectively insolubilizing portions of the photocurable composition on exposure to actinic radiation projected through a mounted transparency positioned with an intermediate air space substantially free of static electricity while over a layer of the liquid photocurable composition. Subsequent to exposure to actinic radiation, the unexposed liquid portion of the composition may be removed from the support to provide a solid relief printing plate.

Relief printing plates have been made of zinc or magnesium metal by photoengraving methods. In photoengraving, a metal surface is coated with a very thin layer of a photosensitive resist composition which is exposed to light through an image-bearing transparency and a reverse image is formed in the photosensitive layer on the metal surface. The unexposed portion of the thin photosensitive layer is then removed by washing, leaving a relief image of the desired image on the metal surface. The relief image is of insufficient depth for printing use and etching, usually with nitric acid, of the metal surface in the unexposed areas is required to render the plate useable commercially. Etching may be carried out continuously or stepwise, and, in either case, shoulders of the plate must be protected to minimize undercutting. This procedure is very costly and time consuming. Further the stepwise etching method results in stepped shoulders which collect ink, thereby necessitating shutdowns for cleaning to avoid smeared impressions on printing.

Photoengraved plates usually require re-etching operations to delineate between the printing and nonprinting areas. In addition, the press life of these plates is usually not of sufficient duration for many large scale printing operations, thus necessitating replication or duplication of the plates, application of more durable coatings, such as chromium metal, and the like. Since replication is difficult because of the non-uniformity of control in the etching process, duplicating methods such as stereotyping or electrotyping are usually employed. However, disadvantages remain, for example, in the electrotyping method in that duplicate plates prepared thereby are usually non-uniform in relief height, thus necessitating additional work to obtain a plate of uniform height.

Recently, solid polymeric materials such as "Dycril" by E. I. du Pont de Nemours & Co. or "KRP" by Eastman Kodak Co. have been substituted for metals in the formation of printing plates. Even with solid polymeric materials, in which images are formed usually by photopolymerization, a period of time is necessary to develop the plate in a solvent or an aqueous caustic system to form a plate merely bordering on that which is considered to be commercially acceptable. In addition, it is also found necessary to mechanically aid the etching operation to remove the unpolymerized portion of the plate with a spray, brush, blotter, sponge or other mechanical means. Such mechanical means, relying on physical contact, typically cause image surface or edge distortions. The total removal of the non-image polymeric material is quite difficult and may require further use of a flammable or toxic solvent system increasing possible harm to persons during relatively long periods of time required to etch to a commercially acceptable degree.

Typically, preparation of printing plates has required intimate contact between a negative or image bearing transparency and the surface forming the printing plate. Great skill is usually required to prepare printing plates by such contact methods and especially in instances when the printing plate is formed of a photopolymerizable composition. It has now been found that by the practice of the present invention printing plates formed of a supported liquid photocurable composition may be prepared simply, in short time, and with commercial acceptability. The present plates may include relief images of uniform printing height suitable for either direct or indirect use as a printing plate.

Generally stated, the present process for preparing printing plates includes the steps of mounting an image bearing transparency on a support, exposing the mounted transparency to a surface static electricity eliminator, positioning the mounted transparency having surface static electricity substantially eliminated for printing plate exposure with a narrow intermediate air space or gap substantially free of static electricity while over a layer of liquid photocurable composition, and exposing the liquid photocurable composition to actinic radiation projected through the transparency. Printing plates may be thus prepared rapidly and at uniform relief by applying a layer of a liquid photocurable composition to one surface of a solid flexible support having a thickness of about 2 to about 50 mils and being in a substantially flat position, adjusting the thickness of the photocurable composition to obtain a substantially uniform thickness in the range of about 3 to about 250 mils, on said support surface, exposing the photocurable composition to actinic radiation through an image bearing, line or halftone, positive or negative transparency consisting solely of opaque and substantially transparent areas wherein the opaque areas are substantially of the same optical density, said transparency being maintained substantially parallel to the layer of the composition with a surface having the static electrical charge substantially eliminated and with an air gap therebetween of about 1 to about 100 mils until substantially complete solidification of the liquid composition takes place in the exposed areas and essentially no solidification takes place in the unexposed areas, and thereafter removing the liquid photocurable composition in the unexposed areas. Desirably, the unexposed areas are removed by means of an aqueous or solvent bath and in one embodiment the bath may be energized by ultrasonic energy to an ultrasonic energy level in the range of about 18 to about 40 kilocycles/sec.

Practice of the present invention will become more apparent from the following detailed description taken in connection with the accompanying drawings wherein like numerals refer to similar elements throughout the several views.

Figure 2:
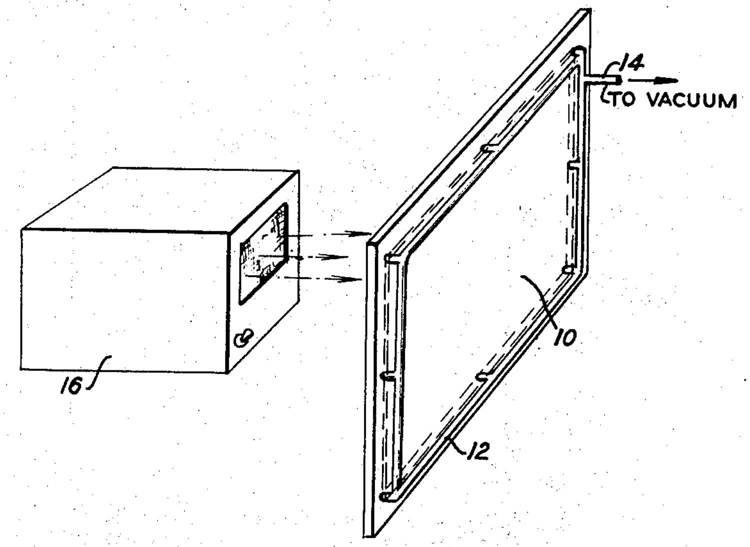
Figure 3:
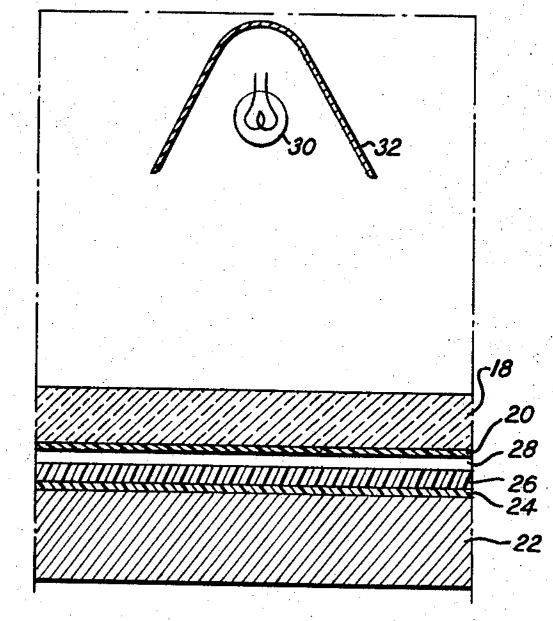

FIG. 1 illustrates a general sequence of preparing printing plates by the practice of the present invention;

FIG. 2 diagrammatically illustrates the exposing of a mounted transparency to a surface static electriicty eliminator; and FIG.3 illustrates as a partial side elevational view the exposing of a liquid photocurable composition to actinic radiation projected through a transparency and intermediate air space.

Referring to the drawings, the process of preparing printing plates by the present invention initially may involve mounting a photographic or image bearing transparency on a suitable support 10 such as transparent glass, plastic or the like. Desirably, vacuum means 12 is included to retain the transparency film to one surface of support 10 with vacuum being received through outlet 14. It is recognized, however, that any suitable support including a film tension retaining rack or frame may be employed if desired to retain the transparency in a substantially flat or planar position.

After the transparency is mounted, it is exposed to an ion generating unit 16 for substantially eliminating surface static electricity. Elimination of static electricity appears to be based on the high specific ionizing power of the alpha particle. Air which is near sources of alpha particles loses its insulating properties and becomes conductive, dissipating any accumulation of static electricity in neighboring substances.

Most any static electricity elimination device may be employed in practice of the present invention. Useful devices include radioactive materials as well as electrical ion generators desirably of the type which generated ions flow in a stream of air. Because radioactive materials may present a health hazard, electrical ion generators are preferred. Examples of useful ion generators include static electricity eliminators generally referred to as aerostat units such as those manufactured by Testane Electronics of Flourtown, Pa.

After the static electricity has been substantially eliminated from the surface of a transparency, the mounted transparency is positioned for printing plate exposure as illustrated in FIG. 3. Transparency mount 18 having transparency 20 mounted thereon is positioned substantially parallel over base 22 having photocurable composition support 24 with photocurable composition 26 thereon. Air gap 28 is maintained substantially free of static electricity and intermediate transparency 20 and photocurable composition 26 to permit close or near contact reproduction with radiation from actinic light 30 within generally parabolic reflector 32. It is found that elimination of static electricity from the surface of the transparency permits near contact reproduction without distortion of the liquid photocurable composition by static electricity between the liquid photocurable composition and the transparency. Since it is recognized that contacting the transparency with the liquid photocurable composition results in disadvantages recognized in prior art methods used heretofore, by maintaining an air gap substantially free of static electricity permits near contact sharp reproduction without defects resulting in the printing plate being prepared.

The term liquid photocurable composition as used herein is intended to mean a liquid composition generally having a viscosity in the range 0 to about 20 million centipoises at 70° C. which is solidified either by photocuring or photopolymerization or both or exposure to radiation from actinic light.

One photosensitive system which is suitable for use in the instant invention is that set out in a copending application having U.S. Ser. No. 674,773, filed Oct. 12, 1967, assigned to the same assignee and incorporated by reference herein. In said system a printing plate may be formed from a layer of a photocurable polymeric composition consisting of a polyene containing at least two unsaturated carbon to carbon bonds per molecule, a polythiol containing two or more thiol groups per molecule and a photosensitizer such as benzophenone. The layer of photocurable composition may be adhered to a support such as rubber, plastic, glass, metal and the like, if desired.

As used in said copending application polyenes and polyynes refer to simple or complex species of alkenes or alkynes having a multiplicity, i.e. at least 2, "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also operable, an example of which is monovinylacetylene, i.e. a polyeneyne as defined. For purposes of brevity all these classes of compounds will be referred to herein as polyenes.

As used herein the term "reactive" unsaturated carbon to carbon groups means groups which will react under proper conditions as set forth herein with thiol groups to yield the thioether linkage $$(-\overset{|}{\underset{|}{C}}-S-\overset{|}{\underset{|}{C}}-)$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, tropolone and the like) which do not under the same conditions react with thiols to give thioether linkages. In the instant invention, products from the reaction of polyenes with polythiols which contain 2 or more thiol groups per average molecule are called polythioether polymers or polythioethers.

One group of polyenes operable in the instant invention to react with polythiols to form printing plates is that taught in a copending application having Ser. No. 617,801 filed Feb. 23, 1967 and assigned to the same assignee and also incorporated herein by reference. This group includes those materials having a molecular weight in the range 50 to 20,000, a viscosity ranging from 0 to 20 million centipoises at 70° C. of the general formula: $[A]-(X)_m$ wherein X is a member of the group consisting of $$R-\overset{R}{\overset{|}{C}}=\overset{R}{\overset{|}{C}}- \text{ and } R-C\equiv C-$$

$m$ is at least 2; R is independently selected from the group consisting of hydrogen, halogen, aryl, substituted aryl, cycloalkyl, substituted cycloalkyl, aralkyl substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amount of hetero atoms such as N, S, P or O but contains primarily carbon-carbon, carbon-oxygen or silicon-oxygen chain linkages without any reactive carbon to carbon unsaturation.

Examples of operable polyenes from this group include, but are not limited to (1) Crotyl-terminated polyurethanes which contain two "reactive" double bonds per average molecule in a near terminal position of the average general formula:

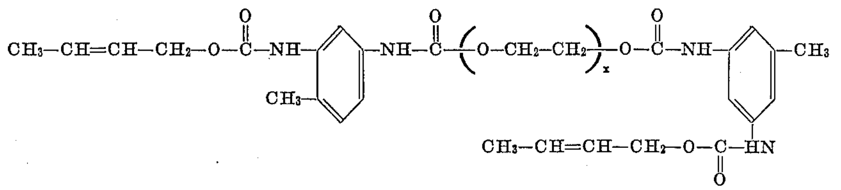

wherein $x$ is at least 1, (2) Ethylene/propylene/non-conjugated diene terpolymers, such as "Nordel 1040" manufactured by Du Pont which contains pendant "reactive" double bonds of the formula:

$$—CH_2—CH=CH—CH_3$$

(3) The following structure which contains terminal "reactive" double bonds:

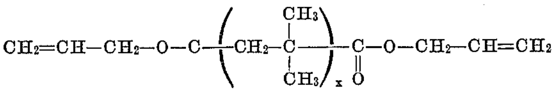

where $x$ is at least 1, and (4) The following structure which contains near terminal "reactive" double bonds:

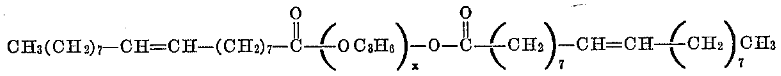

where $x$ is at least 1.

Another group of polyenes operable in the instant invention includes unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyamides, and polyurethanes derived from monomers containing "reactive" unsaturation, e.g., adipic acid-butenediol, 1,6-hexanediamine-fumaric acid and 2,4-tolylene diisocyanate-butenediol condensation polymers and the like. Included in the term "polyenes" as used herein are those materials which in the presence of an inert solvent, aqueous dispersion or plasticizer fall within the viscosity range set out above at 70° C.

A third group of polyenes operable in this invention includes those polyenes in which the reactive unsaturated carbon to carbon bonds are conjugated with adjacent unsaturated groupings. Examples of operable reactive conjugated ene systems include but are not limited to the following:

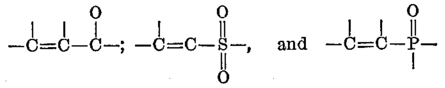

A few typical examples of polymeric polyenes which contain conjugated reactive double bond groupings such as those described above are polyethylenether glycol (600 M.W.) diacrylate; polytetramethylenether glycol (1000 M.W.) dimethacrylate; the triacrylate of the reaction product of trimethylol propane with 20 moles of ethylene oxide; and the like.

As used herein, the term polythiols refers to simple or complex organic compounds having a multiplicity, i.e. at least 2, of pendant or terminally positioned —SH functional groups per average molecule.

On the average the polythiols must contain 2 or more —SH groups/molecule. They usually have a viscosity range of 0 to 20 million centipoises (cps.) at 70° C. as measured by a Brookfield viscometer. Included in the term "polythiols" as used herein are those material which in the presence of an inert solvent, aqueous dispersion or plasticizer fall within the viscosity range set out above at 70° C. Operable polythiols in the instant invention usually have molecular weights in the range 50–20,000, preferably 100-10,000.

The polythiols operable in the instant invention may be exemplified by the general formula $R_8(SH)_n$ where $n$ is at least 2 and $R_8$ is a polyvalent organic moiety free from "reactive" carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any "reactive" carbon to carbon unsaturation.

One class of polythiols operable with polyenes in the instant invention to obtain essentially odorless cured polythioether printing plates are esters of thiol-containing acids of the general formula: $HS—R_9—COOH$ where $R_9$ is an organic moiety containing no "reactive" carbon to carbon unsaturation with polyhydroxy compounds of the general structure: $R_{10}(OH)_n$ where $R_{10}$ is an organic moiety containing no "reactive" carbon to carbon unsaturation and $n$ is 2 or greater. These components will react under suitable conditions to give a polythiol having the general structure:

$$R_{10}\left(O\overset{\overset{O}{\|}}{C}—R_9—SH\right)_n$$

where $R_9$ and $R_{10}$ are organic moieties containing no "reactive" carbon to carbon unsaturation and $n$ is 2 or greater.

Certain polythiols such as the aliphatic monomeric polythiols (ethane dithiol, hexamethylene dithiol, decamethylene dithiol, decamethylene dithiol, tolylene-2,4-dithiol, etc.) and some polymeric polythiols such as a thiol-terminated ethylcyclohexyl dimercaptan polymer, etc. and similar polythiols which are conveniently and ordinarily synthesized on a commercial basis although having obnoxious odors, are operable in this invention. Examples of the polythiol compounds preferred for this invention because of their relatively low odor level and fast curing rate include but are not limited to esters of thiglycolic acid ($HS—CH_2COOH$), $\alpha$-mercaptopropionic acid ($HS—CH(CH_3)—COOH$) and $\beta$-mercaptopropionic acid ($HS—CH_2CH_2COOH$) with polyhydroxy compounds such as glycols, triols, tetraols, pentaols, hexaols, etc. Specific examples of the preferred polythiols include but are not limited to ethylene glycol bis (thioglycolate), ethylene glycol bis ($\beta$-mercaptopropionate), trimethylolpropane tris (thioglycolate), trimethylolpropane tris ($\beta$-mercaptopropionate), pentaerythritol tetrakis (thioglycolate) and pentaerythritol tetrakis ($\beta$-mercaptopropionate), all of which are commercially available. A specific example of a preferred polymeric polythiol is polypropylene ether glycol bis (β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, and after reaction, give essentially odorless cured polythioether end products which are commercially useful resins or elastomers for printing plates.

As used herein the term "odorless" means the substantial absence of the well-known offensive and sometimes obnoxious odors that are characteristic of hydrogen sulfide and the derivative family of compounds known as mercaptans.

The term "functionality" as used herein refers to the average number of ene or thiol groups per molecule in the polyene or polythiol, respectively. For example, a triene is a polyene with an average of three "reactive" carbon to carbon unsaturated groups per molecule and thus has a functionality ($f$) of three. A dithiol is a polythiol with an average of two thiol groups per molecule and thus has a functionality ($f$) of two.

It is further understood and implied in the above definitions that in these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100% of the theoretical value for complete reaction, the functionality (assuming 100% pure starting materials) would be 2.0. If, however, the reaction were carried to only 95% of theory for complete reaction, about 10% of the molecules present would have only one ene functional group, and there may be a trace of material that would have no ene functional groups at all. Approximately 90% of the molecules, however, would have the desired diene structure and the product as a whole then would have an actual functionality of 1.9. Such a product is useful in the instant invention and is referred to herein as having a functionality of 2.

The aforesaid polyenes and polythiols can, if desired, be formed or generated in situ and still fall within the scope of the instant invention.

To obtain the maximum strength, solvent resistance, creep resistance, heat resistance and freedom from tackiness, the reaction components consisting of the polyenes and polythiols of this invention are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of the polyenes and the polythiols containing said functionality are also operable herein.

In general, it is preferred, especially at or near the operable lower limits of functionality in the polyene and polythiol, to use the polythiol and the polyene compounds in such amounts that there is one thiol group present for each ene group, it being understood that the total functionality of the system must be greater than four, and the functionality of the thiol and the diene must each be at least two. For example, if two moles of a triene are used, and a dithiol is used as the curing agent, making the total functionality have a value of five, it is preferable to use three moles of the dithiol. If much less than this amount of the thiol is used, the curing rate will be lower and the product will be weaker in some respects because of the reduced crosslink density. If much more than the stoichiometric amount of the thiol is used, the rate of cure may be higher, if that is desirable, although excessive amounts can lead to a plasticized crosslinked product which may not have the desired properties. However, it is within the scope of this invention to adjust the relative amounts of polyenes and polythiols to any values above the minimum scope disclosed herein which give desirable properties to the crosslinked polythioether. It must be emphasized that regardless of the ratio of polythiol to polyene, the total functionality of the system must be greater than four, or a crosslinked network will not result, and the product will be a swellable, chain-extended composition which is unsuitable for the purpose of this invention. Thus in practicing the instant invention to obtain a solid crosslinked printing plate it is necessary to use a polyene containing at least 2 reactive unsaturated carbon to carbon bonds per molecule in an amount that the combined functionality of the reactive unsaturated carbon to carbon bonds per molecule and the thiol groups per molecule is greater than 4.

Another composition operable to form a relief printing plate by the process of the instant invention is that set out in British Pats. 1,102,910 and 1,007,345. Therein the liquid composition consisting of:

(A) 0.001 to 5% by weight of a polyboron acid salt of the formula $$M'_2(B_nH_{n-p-q}X_pY_q)_{m'} \qquad (I)$$

wherein M' is a silver (I) or cerium (III) cation, X is halogen; Y is a hydroxyl group, or a hydrocarbyloxyalkoxy or hydrocarbylcarbonyl group free of aliphatic unsaturation and containing at most 12 carbon atoms; $n$ is 10 or 12; $p$ is 1 to 12 and is equal to $n$ minus $q$ when $q$ is greater than zero; $q$ is 0 to 2, $p+q$ being at most equal to $n$; and $m'$ is the valence of M' (when $p$ is greater than 1, the halogens represented by X can be the same or different);

(B) A halide promoter in which the halogen is chlorine, bromine or iodine and which is dissociable by actinic light of wavelength between 2500 A.; and 7000 A.; and (C) At least one substance capable of undergoing cationic polymerization is cationically polymerized on exposure to actinic light having a wavelength in the range 2500 to 7000 A. Thus, in carrying out the process in the instant invention any liquid photosensitive composition capable of being photopolymerized or photocured or both upon exposure to actinic radiation to a solid polymer is operable in the process of the instant invention to form a relief printing plate.

Another liquid photocurable composition useful to form printing plates by the process of this invention is that set out in French Pat. No. 1,471,432. Generally, liquid photosensitive compositions disclosed in this patent comprise as essential constituents, an unsaturated polyester, an ethylenically unsaturated monomer leading itself to a reaction of addition polymerization, and a photosensitizer. The unsaturated polyester may be produced from an alcohol monomer containing at least a polyol comprising at least 5 ether-oxygen radicals linked to carbon atoms in its main chain and not having more than 3 carbon atoms between the ether-oxygen radicals, and a monomer of acidic character containing at least an unsaturated dicarboxylic acid and/or one of its derivatives.

The liquid photosensitive compositions to be converted to printing plates may if desired, include such additives as antioxidants, accelerators, dyes, inhibitors, activators, fillers, pigments, antistatic agents, flame-retardant agents, thickeners, thixotropic agents, surface active agents, light scattering agents, viscosity modifiers, extending oils, plasticizers, detackifiers and the like. Such additives are usually preblended with the monomer or compound to be photopolymerized or with the polyene or polythiol prior to or during the compounding step. Operable fillers include natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide and the like. The aforesaid additives may be present in quantities up to 500 parts or more per 100 parts polymer by weight and preferably about 0.005 to about 300 parts on the same basis. Each additive must be present in an amount which will not interfere with or inhibit the necessary photocuring or photopolymerization image-producing reaction or other required steps in the plate making process.

The support to which the photosensitive composition is adhered may be formed from various materials such as rubber, plastic, paper, glass, metal and the like. The support is preferably a plastic having the characteristics of being flexible, adherable to the photosensitive composition on exposure to actinic radiation or by other means and capable of transmitting a substantial amount of the radiation therethrough. The thickness of the support is dependent on its relative strength and dimensional stability to hold a specified thickness of the photosentitive composition and may be empirically determined by one skilled in the art. For example when an oriented polyethylene terephthalate in film form sold under the trade name "Mylar" is employed as the support and a 20 mil relief is desired, the "Mylar" film will have a thickness of about 1 to 10 mils. Non-actinic radiation transmitting metal plates such as aluminum for the same thickness of photosensitive composition usually have a thickness of about 1 to 8 mils.

The photosensitive reaction may be initiated by actinic radiation from sunlight or from special light sources which emit significant amounts of actinic light suitably in the wavelength range of 2500–7000 A. For liquid photosensitive compositions it is preferred that the light emanate from a point source or in the form of parallel rays. However, divergent beams are also operable under certain circumstances as a source of actinic light in the instant invention. Thus it is possible merely to expose the liquid photosensitive composition to actinic radiation, preferably in the range 3000–4000 A., under ambient conditions or otherwise and obtain a solid elastomeric or resinous product useful as a printing plate material after development. Additionally, in liquid photosensitive compositions which are photocured, chemical photoinitiators or sensitizers such as benzophenone, acetophenone, acenapthene-quionone, methyl ethyl ketone, thioxanthen - 9 - one, xanthen-9-one, 7-H-benz[de] anthracen-7-one, dibenzosuberone, 1 - naphthaldehyde, 4,4′ - bis (dimethylamino) benzophenone, fluorene - 9 - one, 1′-acetonaphthone, 2′-acetonaphthone, 2,3 - butanedione, anthraquinone, 1 - indanone, 2 - tert. - butyl anthraquinone, valerophenone, hexanophenone, 8 - phenylbutyrophenone, p - morpholinopropiophenone, 4 - morpholinobenzophenone, 4′-morpholinodeoxybenzoin, p - diacetylbenzene, 4 - aminobenzophenone, 4′ - methoxyacetophenone, benzaldehyde α - tetralone, 9 - acetylphenanthrene, 2 - acetylphenanthrene, 10 - thioxanthenone, 3 - acetylphenanthrene, 3-acetylinodole, 1,3,5-triacetylbenzene, etc. and blends thereof, to greatly reduce the exposure times and thereby when used in conjunction with various forms of energetic radiation yield very rapid, commercially practical cures. The curing rate accelerators are usually added in an amount ranging from about 0.0005 to about 10% by weight of the photocurable composition.

Curing inhibitors or retarders operable in the instant invention include but are not limited to hydroquinone; p - tert-butyl catechol; 2,6,-ditert-butyl-p-methylphenol; phenothiazine and N-phenyl-2-napthylamine.

The thickness of the layer of the liquid photosensitive composition employed depends on the thickness desired in the relief image and one the alignment between the relief figures. That is, if the printing areas are closely aligned less relief is necessary than if the printing areas are further apart. This is to assure that the non-printing areas are not contacted with the surface of the material on which the printing is to occur. In the case of photosensitized half-tones formed from the process of the instant invention, the screening used must be taken into consideration when selecting the proper thickness. In general, the thickness of the layer to be solidified and employed as a printing plate may vary from 3 to 250 mils or more. For letterset (dry offset) plates, the thickness may be customarily in the 3 to 25 mil range; for letterpress printing, thicknesses of 10 to 500 mils are common. For letterpress newspaper or magazine printing plates, the thickness of the photosensitive layer will be about 10 to about 50 mils. Thicker layers are sometimes employed for the flexographic printing of designs and relatively large area with letterpress printing plates.

With the liquid photosensitive compositions of the present invention it is eminently suitable to maintain an air gap substantially free of static electricity between the liquid photosensitive composition and the image-bearing transparency. Such an air gap may range from about 1 to about 100 mils. The air gap substantially free of static electricity facilitates removal of the image-bearing transparency from the close vicinity of the exposed composition after subjecting same to actinic light without defacing the photocurable composition or the transparency with the photocurable composition which may otherwise be attracted thereto.

A printing plate of uniform relief may be prepared from a photocurable composition by exposing said composition as a layer to actinic light through an image bearing transparency until substantially complete curing takes place in the exposed areas and substantially no curing takes place in the non-exposed areas. The plate is then immersed in an aqueous solution containing a soap or detergent and depending on the soap or detergent is etched for periods ranging from 10 minutes up to one hour or more. It is found that using an aqueous solution of detergent or soap in combination with ultrasonic activation of the bath to impart cavitation thereto reduces the etching time to periods of 5 seconds to 10 minutes without enlisting mechanical aids such as brushes, sponges, etc. and the relief obtained is far superior in topographical quality and in fidelity of image reproduction to that previously obtained using photopolymerizable or photocurable materials and, in most cases, far superior to the relief formed from a photoengraved metal plate.

The plate may be immersed in a bath ultrasonically activated preferably to the degree necessary to cause cavitation in the bath, i.e. usually in the energy level range of 18–40 kilocycles/sec. or more and a power density level nominally in the range of 5–20 watts/sq. in. or more. It is obvious that longer cleaning or etching periods are required at the lower power density level, i.e. of the order of 3–10 minutes and that rapid cleaning of the order of 0.5 to 2 minutes may be obtained at the upper power density level for a newspaper page about 15½" x 24". The bath is maintained at a temperature whereat the unexposed area of the photosensitive composition is in the liquid or molten phase. Bath temperatures usually range from room temperature up to the boiling point of water at atmospheric pressure and even higher if a pressurized system is maintained, with the upper limit being set below the softening temperature of the solid photosensitized composition.

Ultrasonic activation of the bath may be produced by various commercially available means. One method is to place transducers on the sides or bottom of the tank containing the bath and connect said transducers to generators to energize same at between 18 to 40 kilocycles/sec. preferably 20 kilocycles/sec. The transducers most commonly used for ultrasonic cleaning are either magnetostrictive made of nickel or its alloys or electrostrictive units made of barium titanate and/or lead zirconate. The dwell time in the bath for the printing plate is of the order of 5 seconds to 10 minutes, depending upon the photosensitive composition used, the thickness of the plate, and the cleaning detergent, soap or solvent employed in the bath. The relief obtained at least in line image areas in such a system constitutes substantially the entire thickness of the photosensitive layer right down to the support. The plate is thereafter removed from the bath and dried in air or in an oven at elevated temperatures up to about 150° C. If desired, the thus formed relief plate may be further subjected to actinic radiation for periods up to 10 minutes to harden and firmly secure the dots in the halftone area and the lines in the line area to their fixed positions.

The greater the difference in solubility and viscosity between the solidified areas in the photosensitized plate and portions of said plate which remain liquid, the greater the efficiency of the etching process to make the relief plate. Thus, it is important to select the right detergent, soap or solvent in the etching bath to facilitate removal by the use of ultrasonics. For the aforementioned photocurable system, the preferred bath is an aqueous bath containing a suitable, commercially available inorganic or organic detergent in an amount ranging from 0.1 to 25% by weight of the aqueous bath. For the aforementioned photopolymerizable system in British 1,102,910, the preferred bath consists of an organic solvent such as acetone or petroleum ether. Etching baths for other liquid photosensitizable compositions are dependent on the aforestated difference in solubility between the liquid and solidified portion of the photosensitized relief plate.

The photocured plate may optionally be subjected to back exposure, if desired, by passage of actinic light through the transparent support to insure adherence of the photosensitized composition to the support and stabilize the relationship therebetween. Such back exposure is usually carried out at a sufficient intensity and period of time to adhere a layer of the photosensitive composition of a thickness up to 10 mils or more, preferably 0.1 to 3 mils throughout the area of the photosensitive composition, depending on the thickness of the relief desired. Thus, for a relief thickness of about 20 mils, back exposure can optionally be employed to adhere to the support a thickness of 1–3 mils of the photosensitive composition throughout its surface area on the support.

The following examples will aid in explaining, but should not be deemed as limiting, the instant invention. In all cases unless otherwise noted, all parts and percentages are by weight.

EXAMPLE 1

To a 2 liter flask equipped with stirrer, thermometer and gas inlet and outlet was charged 450 g. (0.45 mole) of polytetramethylene ether glycol, having a hydroxyl number of 112 and a molecular weight of approximately 1,000, along with 900 g. (0.45 mole) of polytetramethylene ether glycol having a hydroxyl number of 56 and a molecular weight of about 2,000, both commercially available from Quaker Oats Co. The flask was heated to 110° C. under vacuum and nitrogen and maintained thereat for 1 hour. The flask was then cooled to approximately 70° C. whereat 0.1 g. of dibutyl tin dilaurate was added to the flask. A mixture of 78 g. (0.45 mole) of tolylene diisocyanate and 78 g. (0.92 mole) of allyl isocyanate was thereafter added to the flask dropwise with continuous stirring. The reaction was maintained at 70° C. for 1 hour after addition of all the reactants. The thus formed allyl terminated polymer will hereinafter be referred to as Polymer A.

EXAMPLE 2

A liquid photocurable composition was prepared by mixing 102.3 g. of Polymer A from Example 1 herein 7.7 g. of pentaerythritol tetrakis ($\beta$-mercaptopropionate), 1.5 g. benzophenone and 0.1 g. of 2,6-ditertiary-butylmethyl phenol. The mixture was heated to 70° C. to dissolve the benzophenone and produce a clear homogeneous mixture. A suitable mold for making a printing plate was prepared using a 4 mil thick "Mylar" film as a support edged on two sides with a 20 mil thick rubber electric tape thereby forming a frame or mold to partially contain the liquid curable polymer. The mold was leveled on an adjustable flat table and the liquid photocurable composition at a temperature of 70° C. was poured into the mold along an edge of the frame and distributed evenly throughout the mold by means of a doctor blade to form a printing plate of 20 mil thickness on top of the 4 mil "Mylar" support. Shims were placed around the edge of the mold and a test negative of a combination of an 85 line halftone, standard type and reverse type, 65 line gray scale and a solid area vacuum adhered to a glass plate was placed on top of the shims leaving an air gap of 7–12 mils between the surface of the liquid curable composition and the test negative. Prior to placing the negative, the surface thereof was exposed to a static electricity eliminator device and the surface thereof was substantially free of static electricity. The photocurable composition was exposed through the glass plate and the negative to light from a 4000 watt Ascorlux pulsed xenon arc printing lamp commercially available from American Speed Light Co. placed 26" above the support. The exposure was for about 2 minutes during which time the liquid photocurable composition solidified in the image areas. The non-image areas remained a liquid essentially of the same viscosity as prior to exposure.

The photocured printing plate was transferred to an aqueous bath at 170° F. containing 10% of a detergent commercially available under the trade name "Liqui-Nox" from Alconox Inc., New York, N.Y. The bath was ultrasonically activated to produce cavitation in the bath by means of 3 transducers (each one kilowatt) on the bottom of the bath connected to separate generators, each energized at about 21 kc./sec. and a power density level of approximately 8 watts/sq. in. After 1½ minutes in the bath, the printing plate was removed therefrom. The resultant etched plate was completely clear of uncured liquid polymer and had a solid relief image of 20 mils in depth in the exposed photocured line image areas of the plate. The relief was sharp with complete recesses in the bowls of letters such as *o, p,* etc. and the image areas had smooth surfaces and shoulders. The glossy plate was inked and employed in letterpress printing on a Davidson Press Model 816 manufactured by Davidson Corp., Chicago, Ill. The lines were distinct and separate and the dots in the halftone area had excellent definition.

EXAMPLE 3

Example 2 was repeated except that the detergent added to the bath consisted of 3% ethylene glycol and 5% by weight of a commercially available detergent sold under the trade name "Liqui-Nox" commercially available from Alconox Inc., New York, N.Y., and the bath was maintained at 170° F. The resultant etched plate was completely free of uncured liquid polymer and had a solid relief image of 20 mils in depth in the exposed photocured areas of the plate within 3 minutes. The plate was inked and printed resulting in distinct and separate lines and excellent definition of the dots in the halftone area.

EXAMPLE 4

A liquid photocurable composition was prepared by mixing 102.3 g. of Polymer A from Example 1 herein, 7.7 g. of pentaerythritol tetrakis ($\beta$-mercaptopropionate), 1.5 g. benzophenone and 0.1 g. of 2,6-ditertiary-butylmethyl phenol. The mixture was heated to 70° C. to dissolve the benzophenone and produce a clear homogeneous mixture. A sheet of "Mylar" 4 mil thick film was placed on an adjustable flat table and a portion of the photocurable composition at a temperature of 70° C. was poured on the "Mylar" support. The liquid photocurable composition was distributed evenly over the support by means of a doctor blade to a uniform thickness of 20 mils on top of the 4 mil "Mylar" support. Shims were placed around the edge of the support to maintain an air gap of 12 mils between the surface of the liquid curable composition and a test negative of a combination of an 85 line halftone, standard type and reverse type, 65 line gray scale and a solid area. The negative was adhered to a glass plate to maintain it parallel to the surface of the liquid photocurable composition. After the surface of the negative was exposed to a static electricity eliminater, the photocurable composition was exposed through the glass plate and negative to light from an 8000 watt Ascorlux pulsed xenon arc printing lamp commercially available from American Speed Light Co. placed 54" above the plate. The exposure was for about 2 minutes during which time the liquid photocurable composition solidified in the image areas. The non-image areas remained a liquid essentially of the same viscosity as prior to exposure to actinic light.

The photocured printing plate was back exposed and cured through its "Mylar" support by a 9 lamp bank of GEF24T12 black light high output tubes at a distance of 21" therefrom for about 15 seconds to more firmly adhere the photosensitized composition to the support and form a solid 1 mil layer of the photosensitized composition on the support.

The photocured printing plate with a latent image thereon was transferred to an aqueous bath maintained at 170° F. containing 2% by weight of a commercially available detergent sold under the trade name "Du Bois TK" by Du Bois Chemical Co., Cincinnati, Ohio. The bath was ultrasonically activated to produce cavitation in the bath by means of 3 transducers (each one kilowatt) on the bottom of the bath connected to separate generators, each energized at about 21 kc./sec. After 1½ minutes in the bath, the printing plate was removed therefrom. The resultant etched plate was completely clear of uncured liquid polymer and had a solid relief image of 20 mils in depth in the exposed photocured line image areas of the plate. The relief was sharp with complete recesses in the bowls of letters such as *o*, *p*, etc. and the image areas had smooth surfaces and shoulders. To further harden the image and prepare it for printing, the plate was post cured for 2 minutes at a distance of 26" from a 4000 watt Ascorlux pulsed xenon arc printing lamp commercially available from American Speed Light Co. Thereafter the glossy plate was inked and employed in letterpress printing on a Davidson Press Model 816 manufactured by Davidson Corp., Chicago, Ill. The lines were distinct and separate and the dots in the halftone area had excellent definition.

EXAMPLE 5

A mixture of 13.35 g. of 2-methoxyethyl vinyl ether, 0.10 $Ag_2B_{10}Cl_{10}$, 0.6 g. divinyl ether and 1.05 g. of α-p-dibromoacetophenone were agitated in a glass reactor in the dark until a saturated solution was obtained. The solution was poured on a 4 mil thick "Mylar" support placed on an adjustable flat table. The photopolymerizable solution was thereafter distributed evenly over the support to a uniform thickness of 20 mils by means of a doctor blade. Shims were placed at the edge of the support and a test negative of a combination of an 85 line halftone, standard type and reverse type, 65 line gray scale and a solid area under a glass plate was placed on top of the shims leaving an air gap of 10 mils between the surface of the liquid photopolymerizable composition and the test negative. Prior to positioning the negative, the surface thereof was exposed to a static electricity eliminator which substantially removed all static electricity on the surface of the negative. The photopolymerizable composition was exposed through the negative to light from an 8000 watt Ascorlux pulsed xenon arc printing lamp commercially available from American Speed Light Co. placed 54" above the plate. The exposure was for about 2 minutes during which time the liquid photopolymerizable composition solidified in the image areas. The non-image areas remained a liquid essentially of the same viscosity as prior to exposure.

The photopolymerized printng plate was transferred to a petroleum ether bath and the bath was ultrasonically activated to produce cavitation in the bath by means of 3 transducers (each one kilowatt) on the bottom of the bath connected to separate generators, each energized at about 21 kc./sec. After 2 minutes in the bath, the printing plate was removed therefrom. The resultant etched plate was completely clear of unpolymerized liquid polymer and had a solid relief image of 20 mils in depth in the exposed photopolymerized areas in the plate. The relief was sharp with complete recesses in the letters and the image area had smooth surfaces and shoulders. The plate was inked and employed in letterpress printing on a Davidson Press Model 816 manufactured by Davidson Corp., Chicago, Ill. The lines were distinct and separate and the dots in the half-tone area had very good definition.

The printing plates formed by the process of the instant invention may be employed in various types of printing including but not limited to intaglio printing, flexographic printing, letterpress printing, dry offset printing and the like.

Although a preferred embodiment of the invention has been illustrated herein, it is to be understood that various changes and modifications may be made in the construction and arrangement of elements without departing from mils on top of the 4 mil "Mylar" support. Shims were

What is claimed is:

1. A process for preparing printing plates which comprises, mounting an image bearing transparency on a support, exposing the mounted transparency to a surface static electricity eliminator, positioning the mounted transparency having surface static electricity substantially eliminated for printing plate exposure with a narrow intermediate air space over a layer of liquid photocurable composition, and exposing the liquid photocurable composition to actinic radiation projected through the transparency.

2. The process of forming a solid relief printing plate according to claim 1 wherein a layer of a liquid photocurable composition having a viscosity in the range 0 to 20 million centipoises at 70° C. is applied to one surface of a solid flexible support, said support having a thickness of about 2 to about 50 mils and being in a substantially flat position, adjusting the thickness of the composition to obtain a uniform thickness of the composition on said surface in the range of about 3 to about 250 mils, exposing said composition to actinic radiation through an image-bearing, line or halftone, positive or negative transparency consisting solely of substantially opaque and substantially transparent areas wherein the opaque areas are substantially of the same optical density, said transparency being maintained substantially parallel to the layer of the composition with an air gap substantially free of static electricity therebetween of about 1 to about 100 mils until substantially complete solidification of the composition takes place in the exposed areas and essentially no solidification takes place in the unexposed areas, and thereafter etching the exposed plate by removing the liquid photosensitive composition in said unexposed areas in a cleaning bath.

3. The process according to claim 2 wherein the cleaning bath is energized by ultrasonic energy wherein the ultrasonic energy level of the bath varies between about 18 to about 40 kilocycles.

4. The process according to claim 2 wherein the cleaning bath consists essentially of an aqueous solution of a detergent in an amount ranging from about 0.1 to about 25 percent by weight of the aqueous solution.

5. The process according to claim 2 wherein the exposed plate is further subjected to actinic radiation through the support prior to etching.

6. The process according to claim 2 wherein the etched plate is subjected to actinic radiation.

7. The process according to claim 1 wherein the liquid photocurable composition comprises, (1) a polyene containing at least 2 reactive unsaturated carbon to carbon bonds per molecule, (2) a polythiol containing at least 2 thiol groups per molecule, the total combined functionality of (a) the reactive unsaturated carbon to carbon bonds per molecule in the polyene and (b) the thiol groups per molecule in the polythiol being greater than 4, and (3) a curing rate accelerator.

8. The process of claim 7 wherein the curing rate accelerator is selected from the group consisting of benzophenone, acetophenone, acenapthenequinone, methyl ethyl ketone, dibenzosuberone, thioxanthen-9-one, xanthen-9-one, 7-H-benz[de] anthracen-7-one, fluorene-9-one, 1-indanone, and mixtures thereof.

9. The process of claim 7 wherein the polyene is the reaction product of polyoxypropylene diol having a molecular weight of about 2000, tolylene diisocyanate and allyl alcohol in a mole ratio of 1:2:2 respectively and the polythiol is pentaerythritol tetrakis (beta-mercaptopropionate).

10. The process of claim 7 wherein the polyene is the reaction product of polytetramethylene ether glycol having a molecular weight of about 2000 to about 3000 and allyl isocyanate in a mole ratio of 1:2 respectively and the polythiol is trimethylolpropane tris (beta-mercaptopropionate).

11. The process of claim 7 wherein the polyene is the reaction product of a solid polyester diol and allyl isocyanate in a mole ratio of 1:2 respectively and the polythiol is pentaerythritol tetrakis (beta-mercaptopropionate).

12. The process according to claim 1 wherein the liquid photocurable composition comprises (A) at least one substance capable of cationic polymerization, (B) a polyboron compound of the formula $M_2B_nH_{n-p-q}X_pY_q)_m$ wherein M is a member of the group consisting of silver (I) and cerium (III) cation, X is halogen; Y is a member of the group consisting of hydroxyl group, hydrocarbyloxyalkoxy and hydrocarbylcarbonyl group free of aliphatic unsaturation; $n$ is 10 or 12; $p$ is an integer from 1 to 12, $q$ is an integer from 0 to 2, $p+q$ is at most equal to $n$, and $m$ is the valence of M, and (C) a halide promoter dissociable by actinic radiation in a wavelength range of 2500–7000 A. in which the halogen is a member of the group consisting of chlorine, bromine and iodine.

13. The process according to claim 1 wherein the exposed plate is subjected to actinic radiation through the support prior to etching and subsequent to etching is directly exposed to actinic radiation.

References Cited

UNITED STATES PATENTS

| | | | |
|---|---|---|---|
| 2,945,760 | 7/1960 | Ostergaard | 96—48 |
| 3,055,758 | 9/1962 | McDonald | 96—48 |
| 3,145,104 | 8/1964 | Oster et al. | 96—33 |
| 3,306,745 | 2/1967 | Webers | 96—35.1 |
| 3,427,161 | 2/1969 | Lamdon et al. | 96—35.1 |
| 3,474,292 | 10/1969 | Carter | 317—2 |

JOHN T. GOOLKASIAN, Primary Examiner

J. C. GIL, Assistant Examiner

U.S. Cl. X.R.

96—27, 115; 156—5, 14; 317—2